US011106534B2

(12) United States Patent
Sun et al.

(10) Patent No.: US 11,106,534 B2
(45) Date of Patent: Aug. 31, 2021

(54) 3-DIMENSIONAL NAND FLASH LAYER VARIATION AWARE SSD RAID

(71) Applicant: Western Digital Technologies, Inc., San Jose, CA (US)

(72) Inventors: Chao Sun, San Jose, CA (US); Pi-Feng Chiu, Milpitas, CA (US); Dejan Vucinic, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 57 days.

(21) Appl. No.: 16/287,251

(22) Filed: Feb. 27, 2019

(65) Prior Publication Data

US 2020/0272540 A1    Aug. 27, 2020

(51) Int. Cl.
*G06F 11/10*    (2006.01)
*H01L 27/1157*    (2017.01)
(Continued)

(52) U.S. Cl.
CPC .......... *G06F 11/1076* (2013.01); *G06F 3/064* (2013.01); *G06F 3/0656* (2013.01); *G06F 11/108* (2013.01); *G06F 11/1012* (2013.01); *G06F 11/1044* (2013.01); *G06F 11/2094* (2013.01); *G06F 2212/403* (2013.01); *G06F 2212/7203* (2013.01); *G11C 16/0483* (2013.01);
(Continued)

(58) Field of Classification Search
CPC ............ G11C 29/52; G11C 2207/2245; G06F 11/1076; G06F 11/108; G06F 3/064; G06F 3/0656; G06F 11/1012; G06F 11/1044; G06F 2212/7203; G06F 2212/403; G06F 11/2094

See application file for complete search history.

(56) References Cited

U.S. PATENT DOCUMENTS 9,015,561 B1    4/2015 Hu
2011/0296273 A1*    12/2011 Rub ........................ G06F 11/10
714/755

(Continued)

OTHER PUBLICATIONS

Lee, S. et al., "A lifespan-aware reliability scheme for RAID-based flash storage", SAC '11: Proceedings of the 2011 ACM Symposium on Applied Computing, Mar. 2011 pp. 374-379.
(Continued)

*Primary Examiner* — April Y Blair
*Assistant Examiner* — Sazzad Hossain
(74) *Attorney, Agent, or Firm* — Ravi Mohan; Rutan & Tucker, LLP

(57) ABSTRACT

An apparatus is disclosed having a parity buffer having a plurality of parity pages and one or more dies, each die having a plurality of layers in which data may be written. The apparatus also includes a storage controller configured to write a stripe of data across two or more layers of the one or more dies, the stripe having one or more data values and a parity value. When a first data value of the stripe is written, it is stored as a currant value in a parity page of the parity buffer, the parity page corresponding to the stripe. For each subsequent data value that is written, an XOR operation is performed with the subsequent data value and the current value of the corresponding parity page and the result of the XOR operation is stored as the current value of the corresponding parity page.

16 Claims, 11 Drawing Sheets

(51) Int. Cl.
   *G11C 16/04* (2006.01)
   *G11C 29/52* (2006.01)
   *G06F 3/06* (2006.01)
   *G06F 11/20* (2006.01)

(52) U.S. Cl.
   CPC ...... *G11C 29/52* (2013.01); *G11C 2207/2245* (2013.01); *H01L 27/1157* (2013.01)

(56) References Cited

U.S. PATENT DOCUMENTS

| | | |
|---|---|---|
| 2013/0268724 A1 | 10/2013 | Seo et al. |
| 2016/0077903 A1* | 3/2016 | Reddy .................. G06F 11/076 714/704 |
| 2017/0046221 A1 | 2/2017 | Bandic et al. |
| 2017/0091022 A1 | 3/2017 | Khan et al. |
| 2018/0013451 A1* | 1/2018 | Kaynak .............. H03M 13/1128 |
| 2018/0143877 A1* | 5/2018 | Yang ....................... G11C 16/26 |
| 2019/0163409 A1* | 5/2019 | Li ............................. G06F 3/06 |

OTHER PUBLICATIONS

Luo, Y. et al., Improving 3D NAND Flash Memory Lifetime by Tolerating Early Retention Loss and Process Variation. Proc. ACM Meas. Anal. Comput. Syst. (2018), 48 pages.

\* cited by examiner

3-DIMENSIONAL NAND FLASH LAYER VARIATION AWARE SSD RAID

BACKGROUND

Field of the Disclosure

This disclosure relates to data storage devices. More particularly, the disclosure relates to writing data to 3-dimensional NAND (3D NAND) flash storage devices.

Description of the Related Art

Data storage devices may be used to store data used by computing devices. The data that is stored on the data storage devices may become inaccessible, corrupted, damaged, or may have errors. Various error correction and/or detection schemes, codes, algorithms, functions, operations, etc., maybe used to protect the data that is stored on the data storage devices, from loss. For example, when writing to a data storage device, a storage controller may utilize error correction codes (ECC) to detect and correct errors in the writing process.

SUMMARY

In some implementations, the present disclosure relates to a method. The method includes writing a stripe of data across two or more layers of one or more dies, the stripe having one or more data values and a parity value. Responsive to writing a first data value of the stripe, the first data value is stored as a current value in a parity page of a parity buffer. The parity page corresponds to the stripe. Responsive to writing each subsequent data value of the stripe, an XOR operation is performed with the subsequent data value and the current value of the corresponding parity page and the result is stored as the current value of the corresponding parity page.

In some implementations, the present disclosure relates to an apparatus. The apparatus includes a parity buffer having a plurality of parity pages, one or more dies, each die having a plurality of layers in which data may be written, and a storage controller configured to write a stripe of data across two or more layers of each of the one or more dies, the stripe having one or more data values and a parity value. Responsive to writing a first data value of the stripe, the controller may store the first data value as a current value in a parity page of the parity buffer, the parity page corresponding to the stripe. Responsive to writing each subsequent data value of the stripe, the controller may perform an XOR operation with the subsequent data value and the current value of the corresponding parity page find store a result as the current value of the corresponding parity page.

In some implementations, the present disclosure relates to a non-transitory machine-readable medium having executable instructions to cause one or more processing devices to perform a method. The method comprising writing a stripe of data across two or more layers of one or more dies, the stripe having one or more data values and a parity value. Responsive to writing a first data value of the stripe, the first data value is stored as a current value in a parity page of a parity buffer. The parity page corresponds to the stripe. Responsive to writing each subsequent data value of the stripe, an XOR operation is performed with the subsequent data value and the current value of the corresponding parity page and the result is stored as the current value of the corresponding parity page.

BRIEF DESCRIPTION OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
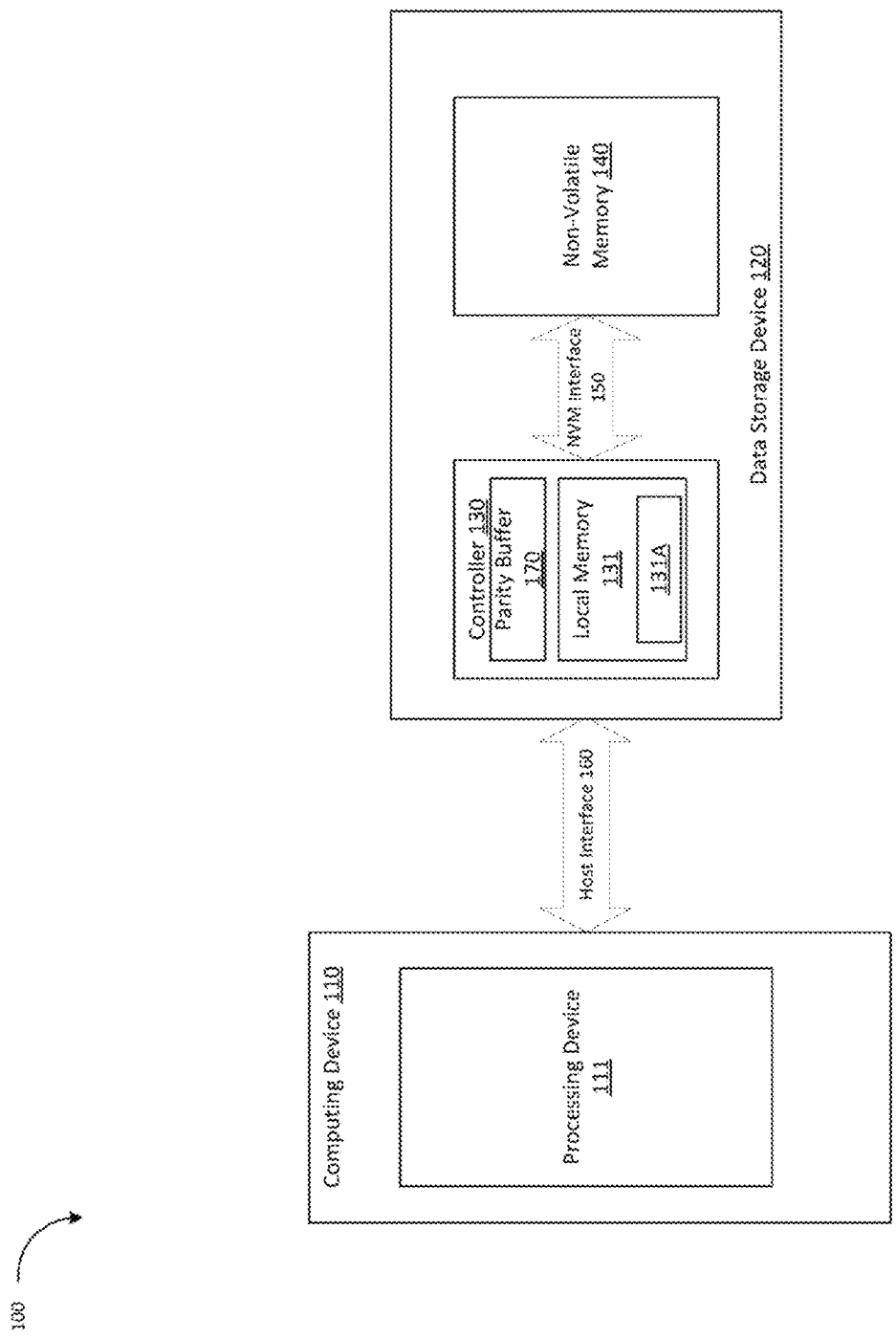
FIG. 1 is a diagram illustrating an example data storage system, in accordance with one or more embodiments of the present disclosure.

In the following disclosure, reference is made to examples, implementations, and or embodiments of the disclosure. However, it should be understood that the disclosure is not limited to specific described examples, implementations, and/or embodiments. Any combination of the features, functions, operations, components, modules, etc., disclosed herein, whether related to different embodiments or not, may be user to implement and practice the disclosure. Furthermore, although embodiments of the disclosure may provide advantages and or benefits over other possible solutions, whether or not a particular advantage and or benefit is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in the claim(s).

The headings provided herein are for convenience only and do not necessarily affect the scope or meaning of the claimed invention. Disclosed herein are example implementations, configurations, and or embodiments relating to storing neural networks and weights for neural networks.

Data storage devices, such as solid state drives (SSDs), hard disk drives (HDDs), hybrid drives (e.g., storage drives/devices that include both magnetic media medium and flash memory), etc., typically include one or more controllers coupled with one or more non-volatile memory (NVM)

arrays. Stored data may be subject to loss and or corruption. For example, data may be lost, damaged, corrupted, etc., due to failure of memory cells, damage (e.g., physical damage), degradation, read write disturbs, loss of data retention, loss of endurance, etc. Data storage devices may generally utilize one or more error correction codes (ECCs) and or error coding mechanisms to detect and or correct errors in the data that is stored within the data storage devices (e.g., stored within the NVM arrays). Some ECC are tunable to adapt to media error characteristics. The required strength of the ECC depends on, among other factors, the residual bit error rate (RBER) and the endurance of the SSD, also known as the end of life (EoL). More specifically, as an SSD reaches its EoL (and thus, the media characteristics wear down), the RBER of the media will increase thus requiring a stronger ECC. As the strength of the required ECC increases, the computational resources and or storage space used by the data storage device also increase. For example, a stronger ECC may use more computational resources (e.g., more computing power) to decode codewords. In another example, a strong ECC may use more storage space (e.g., more bits, bytes, etc., of data) to store codewords generated using the stronger ECC. Redundant Array of Independent Disks (RAID) involves the use of multiple disks (or, dies) and may be used when the RBER has increased beyond an ECC's error correction capability.

In 3D NAND memory, the RBER can differ from die to die, layer to layer and even from the most significant hit (MSB) to the least significant bit (LSB) of a word line of a layer. However, default ECC coding schemes select the strength of the ECC based on RBER of the layer with the worst RBER. Although a data stripe may be written to a 3D NAND memory in such a way that the layer to layer RBER variation is averaged across different RAID groups, in order to avoid disrupting the programming sequence, a word line in each chip must be left blank. This results in a computational overhead and or storage space overhead which is undesirable.

FIG. 1 is a diagram illustrating an example data storage system 100, in accordance with some embodiments of the present disclosure. The data storage system 100 includes a computing device 110 and a data storage device 120. The computing device 110 may also be referred to as a host system. In one embodiment, the data storage device 120 may be part of the computing device 110 (e.g., may be located inside of a housing, chassis, case, etc., of the computing device 110). In another example, the data storage device 120 may be separate from the computing device 110 (e.g., may be an external device that is coupled to the computing device 110 via a cable, such as a universal serial bus (USB) cable).

The data storage device 120 may incorporate access command scheduling and or execution in accordance with embodiments, examples, and or implementations disclosed herein. The data storage device 120 may be any type of data storage device, drive, module, component, system, or the like. Furthermore, the terms "drive" and "data storage drive" may be used herein in certain contexts to refer to any type of data storage device, and may be used substantially interchangeably with the term "data storage device" herein in connection with various embodiments and or in various contexts. As shown, the data storage device 120 (e.g., hybrid hard drive, solid-state drive, any storage device utilizing solid-state memory, etc.) includes a controller 130 (e.g., control circuitry, software, firmware, or a combination thereof) and non-volatile memory 140.

The non-volatile memory (NVM) 140 may be configured for long-term storage of data and may retain data between power on/off cycles of the data storage device 120. The non-volatile memory 140 and or portions of the non-volatile memory 140 may also be referred to as a storage medium. In some embodiments, the non-volatile memory 140 may include solid-state memory. Solid-state memory may comprise a wide variety of technologies, such as 3D NAND memory or 2D NAND memory (e.g., single-level cell (SLC) memory, multi-level cell (MLC) memory, triple level cell (TLC) memory, X4 or quad-level cell (QLC) memory, etc.). The non-volatile memory 140 may include any combination of the one or more types of memories described here. The non-volatile memory 140 may be divided logically and/or physically into dies (or, chips), layers, word lines, army's, planes, blocks, pages, tracks, and sectors.

The controller 130 may include one or more processors, memory devices, data and or power transmission channels/paths, boards, or the like. In some embodiments, the controller 130 may be implemented as one or more system-on-a-chip (SoC) modules, field-programmable gate array (FPGA) modules, application-specific integrated circuit (ASIC) modules, processing devices (e.g., processors), chips, or the like. In other embodiments, one or more components of the controller 130 may be mounted on a printed circuit board (PCB). The controller 130 may be configured to receive data commands from a storage interface (e.g., a device driver) residing on the computing device 110. FIG. 1 illustrates controller 130 having a local memory 131, and module 131A stored therein. Controller 130 may execute module 131A to perform the operations described herein with respect to FIGS. 5A-5D and 6.

The controller 130 may also include a parity buffer 170. Parity buffer 170 may comprise a storage class memory (also known as persistent storage memory). Because it is persistent, parity buffer 170 may retain its data even during a power cycle. As described in further detail herein, parity buffer 170 may be organized into a number of pages for use in writing stripes of data.

The controller 130 may communicate with the computing device 110 over a host interface 160, and may receive commands via the host interface 160. These commands may be referred to as data commands, data access commands, data storage access commands, etc. Data commands may specify a block address in the data storage device 120. Data may be accessed transferred based on such data commands. For example, the controller 130 may receive data commands (from the computing device 110) and may execute such commands on in the non-volatile memory 140 (e.g., in one or more arrays, pages, blocks, sectors, etc.). The data commands received from computing device 110 may include read data commands, write data commands, and erase data commands. The controller 130 may be coupled to the non-volatile memory (NVM) 140 via a NVM interface 150. In one embodiment, the NVM interface 150 may include a plurality of channels (e.g., one or more lines, pines, wires, traces, etc.) and each channel may be coupled to different portions of the non-volatile memory 140 (e.g., different NVM arrays, different flash arrays, etc.).

The controller 130 may execute the received data commands to read, write, and erase data from non-volatile memory 140, via the NVM interface 150. For example, the commands may include a read command (e.g. a data read command) to read a block of data from the non-volatile memory 140. The controller 130 may read the data from the page and may transmit the data to the computing device 110 via the host interface 160. In another example, the commands may include a write command (e.g., a data write command) to write data to a page in a non-volatile memory 140. In one embodiment, write commands may include program commands (e.g., a command to write the value "1" to a location the non-volatile memory 140) and erase commands (e.g., a command to write the value "0" to a location, a page, a block, etc., in the non-volatile memory array). The controller 130 may receive the data from the computing device 110 via the host interface 160 and may write the data to the page. The host interface 160 may include hardware (e.g., wires, pins, traces, connectors, etc.), software (e.g., drivers), firmware, or a combination thereof, that allows the processing device 111 and or the computing device 110 to communicate data with the data storage device 120. Examples of a host interface may include a peripheral component interconnect express (PCIe) bus, a serial AT attachment (SATA) bus, a non-volatile memory express (NVMe) bus, etc.

The data storage device 120 may store data received from the computing device 110 such that the data storage device 120 acts as data storage for the computing device 110. To facilitate this function, the controller 130 may implement a logical interface. The logical interface may present to the computing device memory a set of logical addresses (e.g., sequential/contiguous addresses) where data may be stored. Internally, the controller 130 may map logical addresses to various physical memory addresses in the non volatile memory arrays and or other memory module(s). Mapping data indicating the mapping of logical addresses to physical memory addresses may be maintained in the data storage device. For example, mapping table data may be stored in non-volatile memory 140 in order to allow for recreation of mapping tables following a power cycle.

The controller 130 may encode data when storing the data on the non-volatile memory 140. The controller 130 may encode the data to protect the data from errors, loss, corruption, etc. The controller 130 may protect the data from errors, loss, corruption, etc., using various methods, techniques, functions, operations, actions, etc. In one embodiment, the controller 130 may protect the data by generating parity data (e.g., parity bits). The parity data may allow the controller 130 to determine whether there am errors in the data (e.g., errors due to corruption, damaged cells, damaged blocks, error while leading the data, etc.). The parity data (e.g., one or more parity bits) may be generated using various algorithms, techniques, functions, operations, etc. In another embodiment, the controller 130 may use an ECC to generate codewords. The codewords may also allow the controller 130 (e.g., the decoder 132) to correct or recover from errors in the codewords.

The controller 130 may also decode data that is stored on the non-volatile memory 140. In one embodiment, controller 130 may decode codewords which encode the data that is stored on the non-volatile memory 140. In another embodiment, the controller 130 may perform error detection to determine the integrity of data retrieved from non-volatile memory 140 (e.g., to determine whether the data has errors). For example, the controller 130 may use parity data to check the data to determine whether there is an error in the data (e.g., whether one or more bits in the data are incorrect due to corruption, damage cells, damaged blocks, etc.). In 3D NAND memory, the RBER can differ from die to die, layer to layer and even from the most significant bit (MSB) to the least significant bit (LSB) of a word line of a layer. Because default ECC coding schemes select the strength of the ECC based on RBER of the layer with the worst RBER, a stronger ECC is generally required. As the strength of the required ECC increases, the computational resources and/or storage space used by the data storage device also increases.

Embodiments of the present disclosure include distributing a data stripe across a word line of each layer of each die in non-volatile memory 140. In this way, the RBER variation seen between the MSB and the LSB of word lines, between layers, and between dies may be averaged across all the values of a stripe thereby allowing controller 130 to determine an ECC for the stripe based on the average RBER, instead of the worst case RBER. This results in a weaker ECC and saving of computational resources and/or storage space.

Figure 2A:
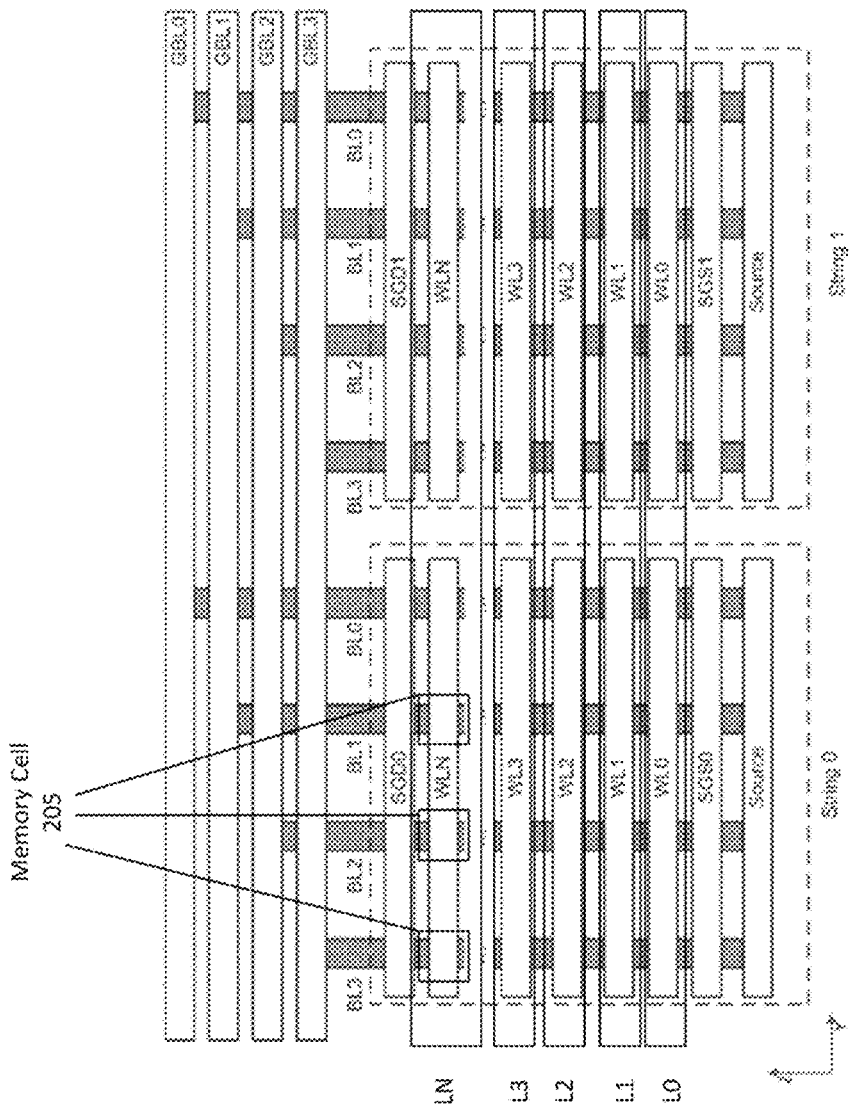
FIG. 2A is a diagram illustrating an example 3D NAND architecture, in accordance with one or more embodiments of the present disclosure.
Figure 3:
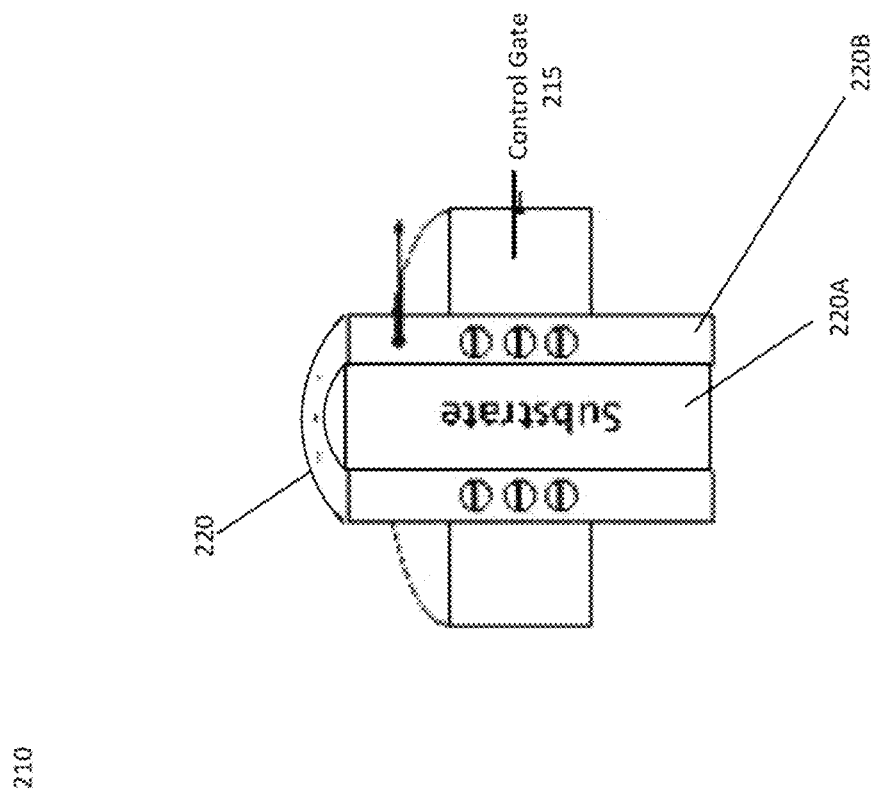
FIG. 3 is a diagram illustrating an example charge trap memory cell, in accordance with some embodiments of the present disclosure.

FIG. 2A shows a memory structure of a block 200 of 3D NAND memory, which may correspond to memory 140 (illustrated in FIG. 1). More specifically, FIG. 2A illustrates a cross section along the bit line direction (along y-direction) in which straight vertical NAND strings (depicted as siring 0 and string 1) extend from common source connections in or near a substrate to global bit lines (GBLO-GBL3) that extend over the physical levels of memory cells. FIG. 2A also illustrates layers L0-LN and the corresponding word lines WL0-WLN in a given physical level in a block. The word lines WL0-WLN are formed from a sheet of conductive material. FIG. 2A also illustrates bit lines BLO-BL3, each of which comprise a memory hole structure having a substrate and a charge trap (shown in FIG. 3) that extend down through these sheets of conductive material thereby forming memory cells 205 where a bit line and word line intersect (as further illustrated in FIG. 3). The memory cells are connected in series vertically (along the z-direction) by the vertical bit lines BLO-BL3. The sheet of conductive material may comprise a control gate of each memory cell formed in this way and thus the control gates of cells in the same layer (along the Y axis) may be linked to form a word line. FIG. 3 illustrates a cross-section of a memory cell 210 in accordance with some embodiments. As discussed above, the memory cell 210 may comprise a control gate 215 (e.g., the conductive material from a word line illustrated in FIG. 2A) and a memory hole structure 220 having a substrate 220A and a charge trap 220B (e.g. a bit line of FIG. 2A). Referring back to FIG. 2A, each bit line BL0-BL3 now connects together 1 charge trap cell from each layer of the chip. For example, within a given block there are multiple NAND strings connected to a given global bit line (e.g. GBLO connects with multiple BLOs). NAND strings are grouped into sets of strings that share common select lines. Thus, for example, NAND strings that are selected by source select line SGSO and drain select line SGDO may be considered as a set of NAND strings and may be designated as String 0, while NAND strings that are selected by source select line SGS1 and drain select line SGD1 may be considered as another set of NAND strings and may be designated as String 1 as shown. A block may consist of any suitable number of such separately-selectable sets of strings. It will be understood that FIG. 2A shows only portions of GBLO-GBL3, and that these bit lines extend further in the y-direction and may connect with additional NAND strings in the block and in other blocks. Furthermore, additional bit lines extend parallel to GBLO GBL3 (e.g. at different locations along x-axis, in front of, or behind the location of the cross-section of FIG. 2A).

Figure 2B:
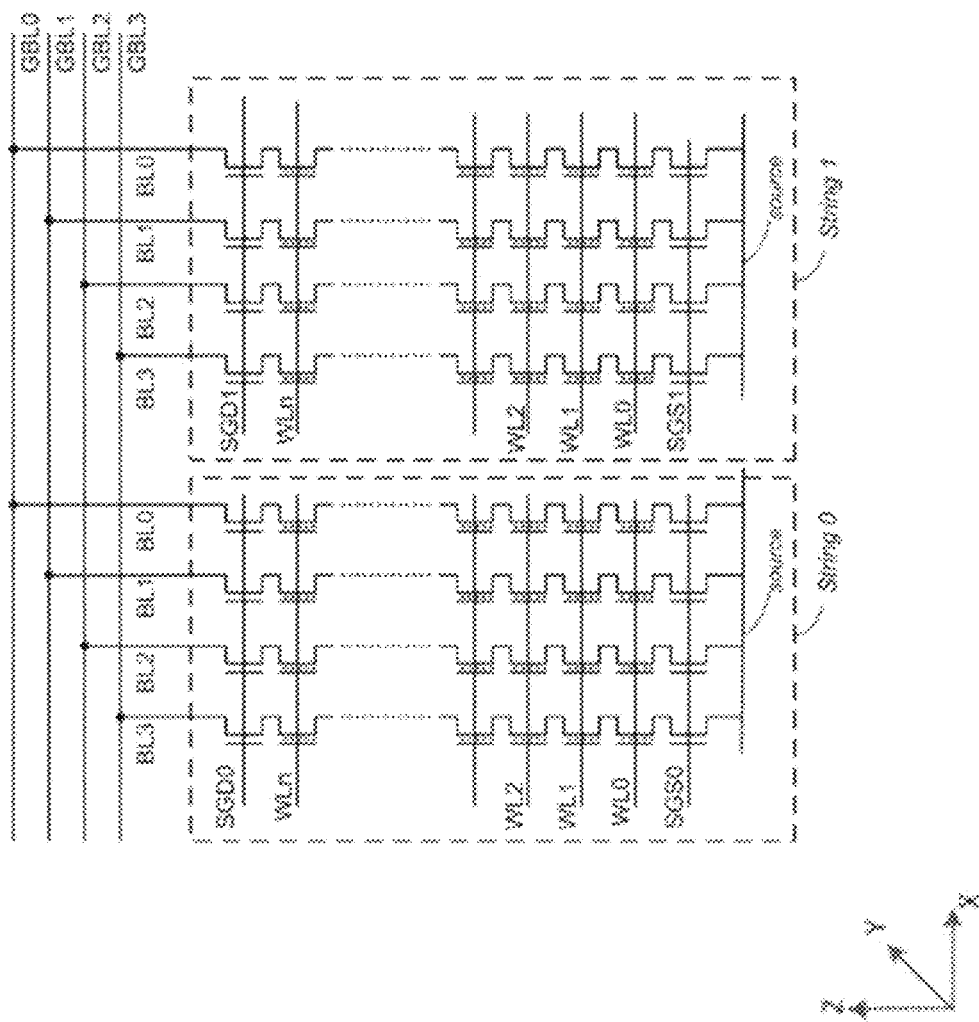
FIG. 2B is a diagram illustrating a circuit representation of the example 3D NAND architecture of FIG. 2A, in accordance with one or more embodiments of the present disclosure.

FIG. 2B illustrates separately-selectable sets of NAND strings of FIG. 2A schematically. It can be seen that each of the global bit lines (GBLO-GBL3) is connected to multiple separately selectable sets of NAND strings (e.g. GBLO connects to vertical bit line BLO of String 0 and also connects to vertical bit line BLO of String 1) in the portion of the block shown. In some cases, word lines of all strings of a block are electrically connected, e.g. WLO in string 0 may be connected to WL0 of String 1, String 2, etc. Such word lines may be formed as a continuous sheet of conductive material that extends through all sets of strings of the block. Source lines may also be common for all strings of a block. For example, a portion of a substrate may be doped to form a continuous conductive region underlying a block that is isolated from similar conductive regions underlying other blocks thus allowing separate biasing to erase a block as a unit Source and drain select lines are not shared by different sets of strings so that, for example, SGDO and SOSO can be biased to select String 0 without similarly biasing SGD1 and SGS1. Thus, String 0 may be individually selected (connected to global bit lines and a common source) while String 1 (and other sets of strings) remain isolated from global bit lines and the common source. Accessing memory cells in a block during programming and reading operations generally includes applying select voltages to a pair of select lines (e.g. SGSO and SGDO) while supplying unselect voltages to all other select lines of the block (e.g. SCS1 and SGD1). Then, appropriate voltages are applied to word lines of the block so that a particular word line in die selected set of strings may be accessed (e.g. a read voltage is applied to the particular word line, while read-pass voltages are applied to other word lines). Erasing operations may be applied on an entire block (all sets of strings in a block) rather than on a particular set of strings in a block.

Figure 4:
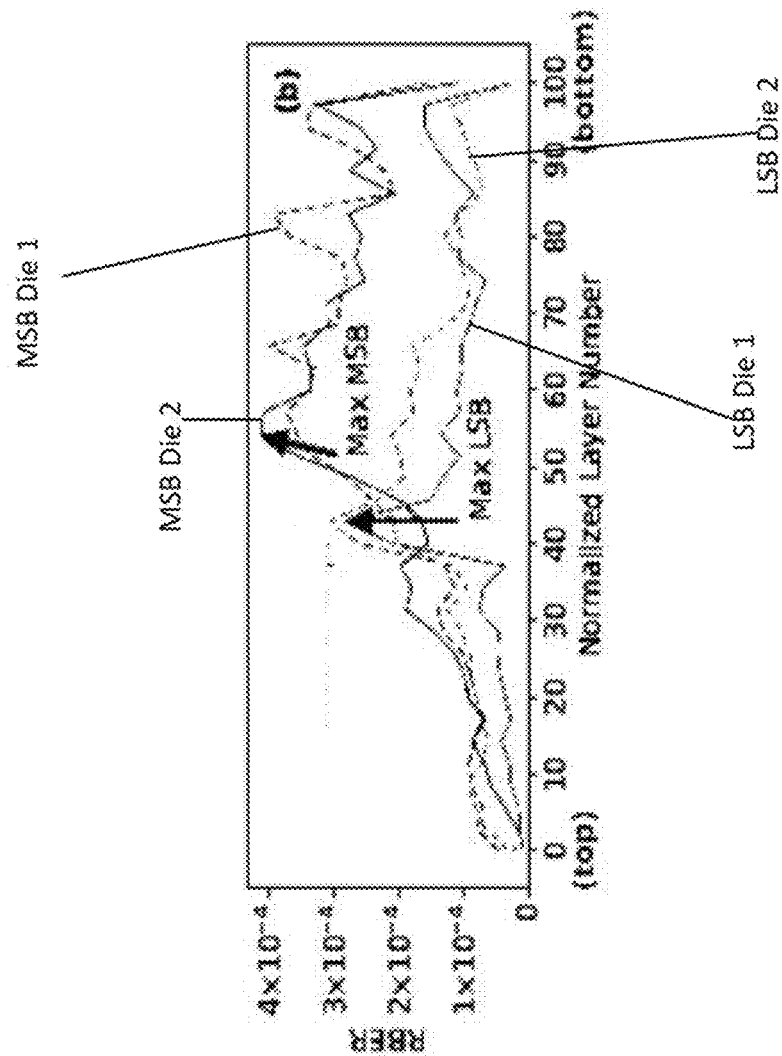
FIG. 4 is a graph illustrating example RBER rates across layers for 2 separate memory dies, in accordance with one or more embodiments of the present disclosure.

FIG. 4 illustrates a graph 400 of example residual bit error rate (RBER) across the layers of 2 separate dies. The graph 400 shows the RBER over the least significant bit (LSB) and most significant bit (MSB) of 2 separate memory dies. Graph 400 shows plots for the RBER variation over layers for the most significant bit and least significant bit of a first die (MSB die 1 and LSB die 1) and the most significant bit and least significant bit of a second die (MSB die 2 and LSB die 2). As can be seen, the RBER varies greatly from layer to layer and from MSB to LSB in the word line for each layer. Because of this variation, traditionally the required strength of the ECC is based on the worst RBER (depicted as MAX MSB in FIG. 3). However, as discussed further herein, this layer to layer and MSB to LSB RBER variation may be averaged across the data values in each stripe to be written, such that each stripe has an RBER that is an average of the RBER across the layers. In this way, the strength of the ECC required to w rite a stripe of data is reduced, as the ECC is now selected based on the average RBER, instead of the worst RBER.

Figure 5A:
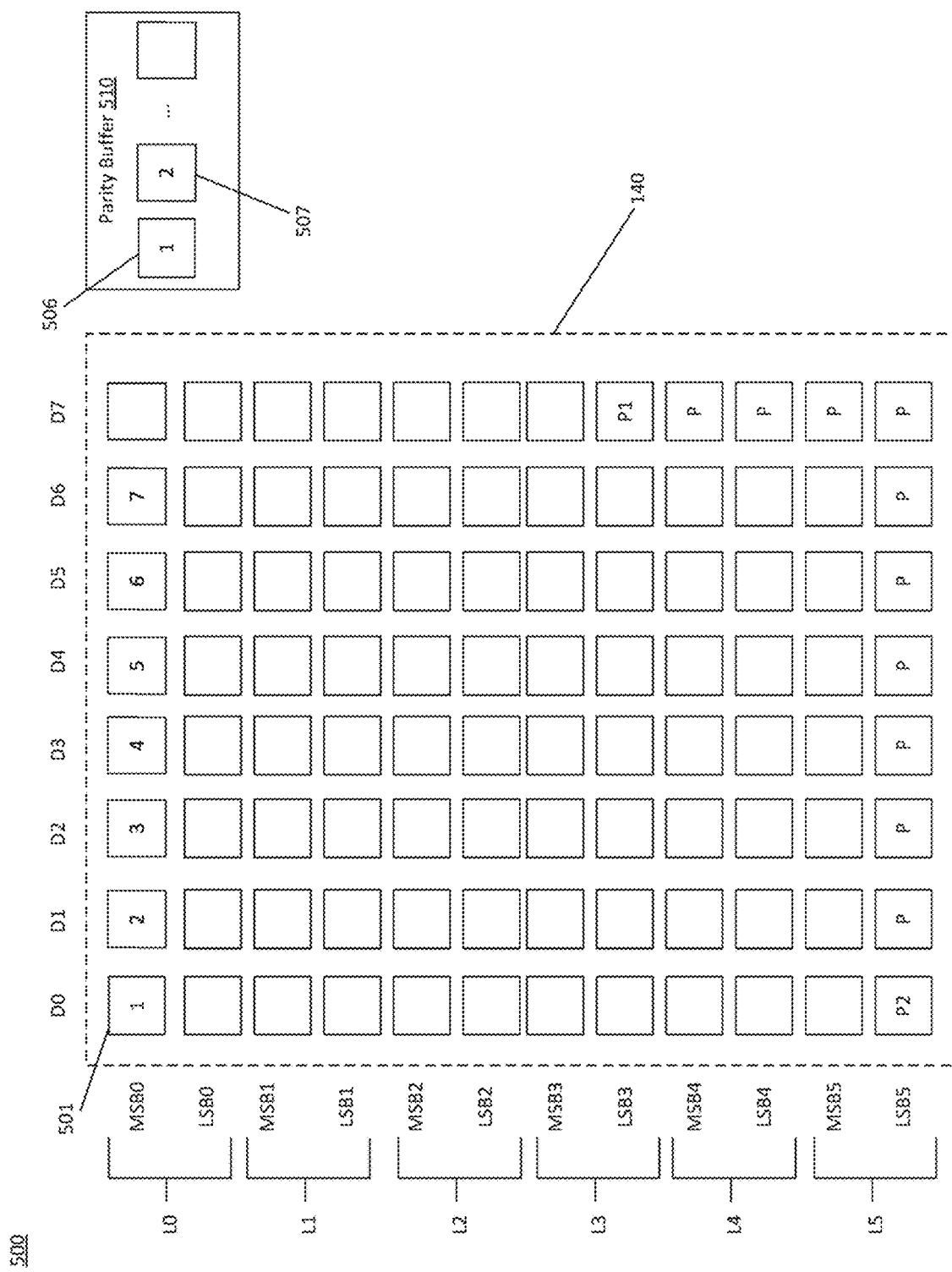
FIGS. 5A-5D are block diagrams illustrating a logical layout of an example data storage device in accordance with one or more embodiments of the present disclosure.

FIG. 5A illustrates a logical layout 500 of a data storage device, such as data storage device 120 of FIG. 1. The logical layout 500 may also be referred to as a logical arrangement. In the example shown in FIG. 5A, non-volatile memory 140 comprises 8 dies D0-D7, and 12 pages per die, however non-volatile memory 140 may comprise any appropriate number of dies and pages per die. Each die may have layers L0-L5, and each layer may include a word line (not shown) including a most significant bit and a least significant bit. FIG. 5A also illustrates parity buffer 170, having a plurality of parity pages. The number of parity pages in parity buffer 170 may correspond to the smaller value between the number of pages per die or 2N−1, where N is the stripe size (i.e. number of values in a stripe including data and parity). In response to receiving a request to write data stripes 1-8 (e.g., from computing device 110), controller 130 may write data stripes 1-8 to the non-volatile memory 140 as discussed herein. As shown in FIGS. 5A-5D, the data values of each stripe may be represented by the number of that stripe, while the parity value for each stripe may be represented by "P." For example, each data value in stripe 1 may be denoted by "1" and the parity value 505 of stripe 1 may be denoted by "P1." FIG. 5A illustrates the location of the parity values for each stripe 1-8. As can be seen, controller 130 may write the first value of each stripe across the 8 dies. Upon writing the first data value of stripe 1 ("1" and denoted as 501), controller 130 may store this value as the current value of a parity page 506 of the SCM parity buffer 170 corresponding to stripe 1. Similarly, upon writing the first value of stripe 2 ("2"), controller 130 may store this value as the current value of a parity page 507 corresponding to stripe 2.

Figure 5B:
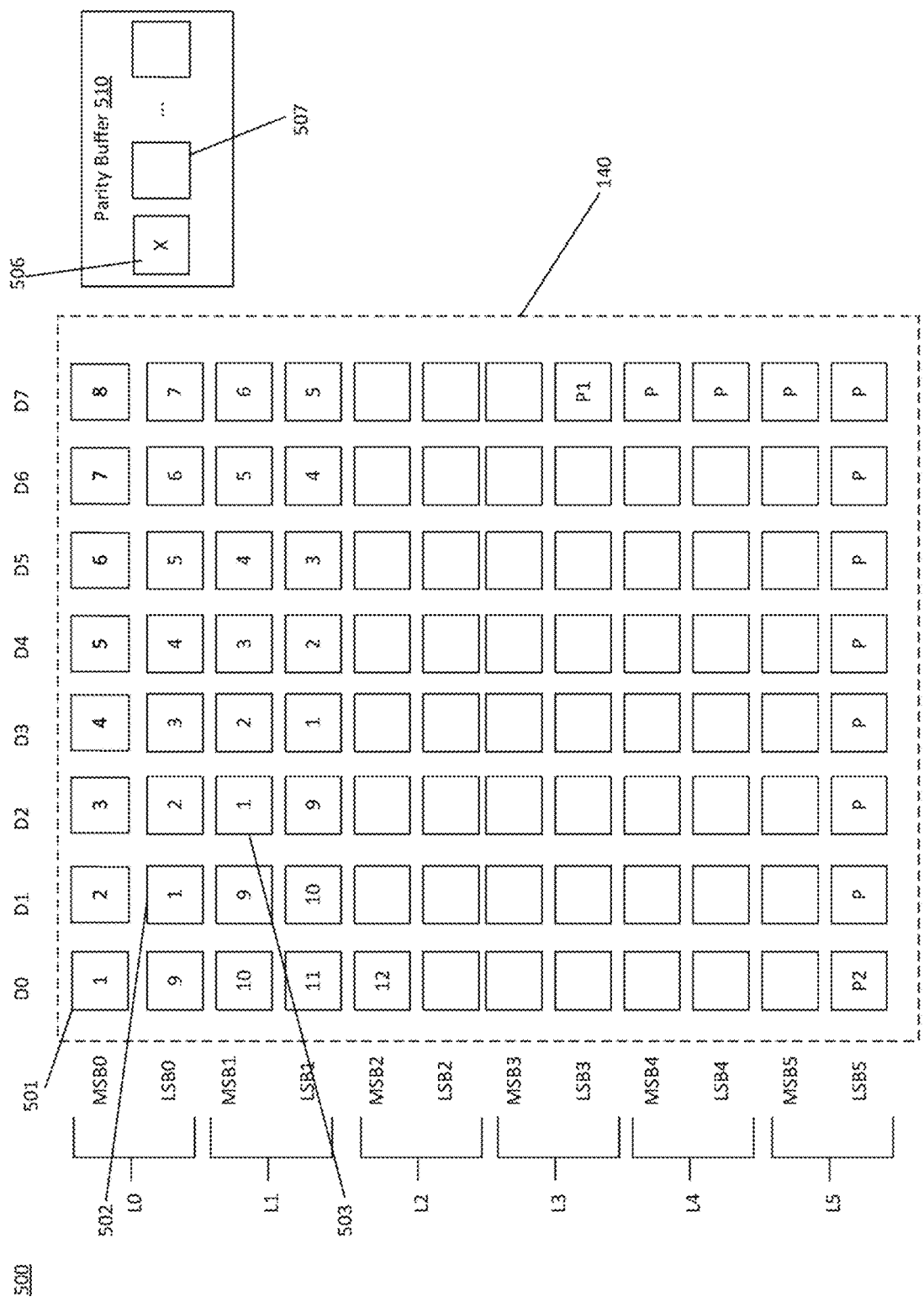

FIG. 5B illustrates the logical layout 500 after additional values from each stripe have been written. As illustrated in FIG. 5B, the data values of each stripe are written across each layer L0-L5 of each die D0-D7, and across a word line of each layer. To write data values of a stripe across a word line, the controller 130 may write a first data value of a stripe (e.g., 501) into the most significant bit page of a word lino corresponding to L0 (MSB0) on D1 and write a second data value of the stripe (e.g., 502) into the least significant bit page of the word line corresponding to L0 (LSB0) on D1. Controller 130 may write a third data value of the stripe into the MSB1 of the word line corresponding to L1 on D2, and write a fourth data value of the stripe into the LSB1 of the word line corresponding to L1 on D2. For each data value of stripe 1 that is written, controller 130 may perform an XOR operation with that data value and the current value of the parity page 506 and store the result as the new current value of the parity page 506. For example, in response to writing the second data value (e.g., 502) of Stripe 1, controller 130 may perform an XOR operation with the second data value 502 and the current value of the parity page 506 (in this case, first data value 501) and store the result as the current value of the parity page 506. Upon writing the third data value 503 of Stripe 1, controller 130 may perform an XOR operation with the third data value 503 and the current value of the parity page 506 and store the result (shown in FIG. 5B as "X") as the current value of the parity page 506. Controller 130 may continue in this fashion until each data value of stripe 1 is written and may write each stripe 1-8 in a similar fashion as described above.

Figure 5C:
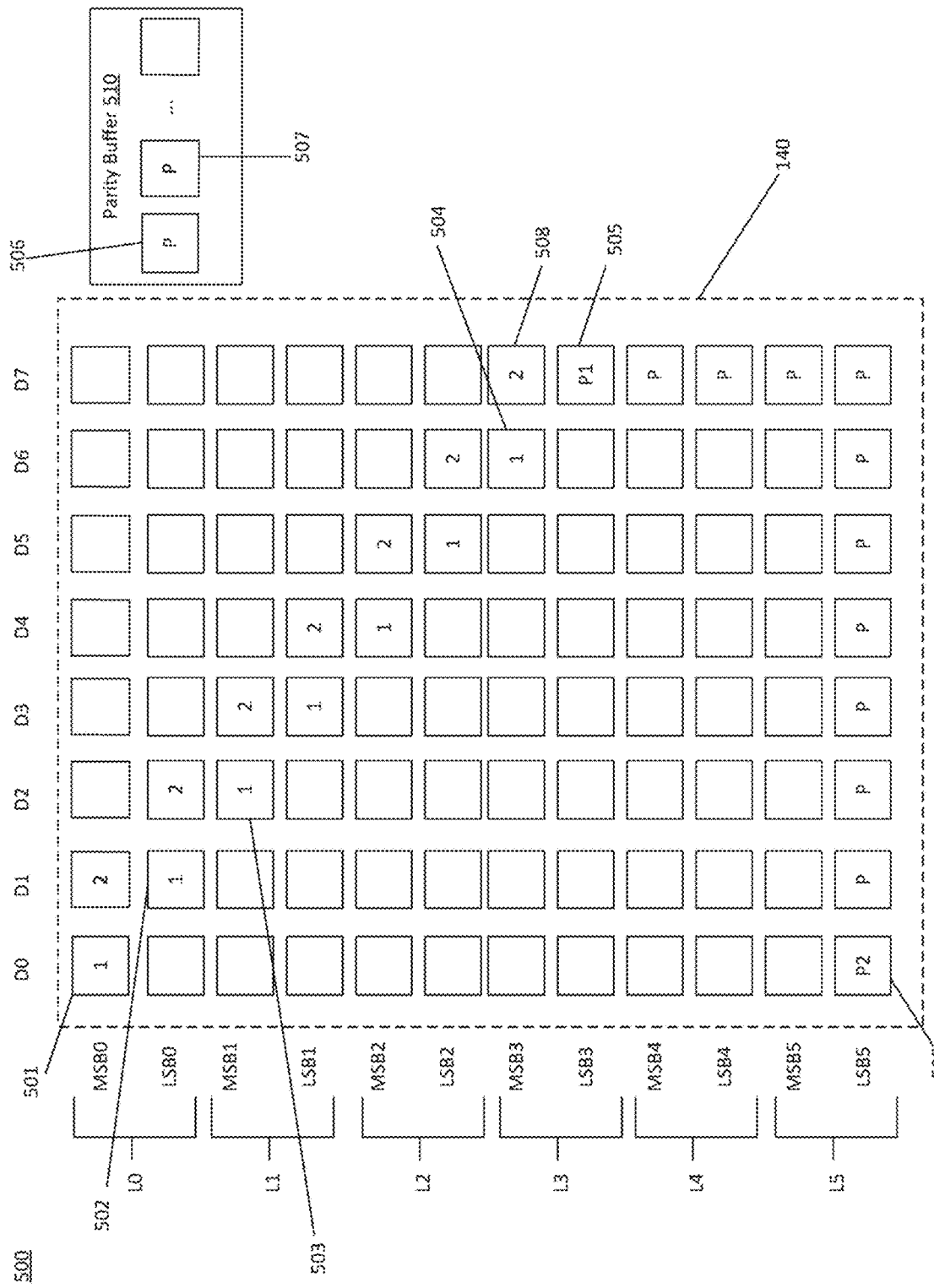

FIG. 5C illustrates the logical layout 500 after all of the data values of Stripe 1 have been written. Upon writing the final data value 504 of stripe 1, controller 130 may perform an XOR operation with the final data value 504 and the current value of the parity page 506 (the parity page corresponding to Stripe 1) and store the result (shown in FIG. 5C as "P") as the current value of the parity page 506 corresponding to Stripe 1. Controller 130 may then write the current value of the parity page 506 to the location of the parity value 505 (denoted in FIG. 5C as "P1") for stripe 1 (i.e. the parity value 505 of Stripe 1 may be assigned the current value of parity page 506). Similarly, upon writing the final data value 508 of stripe 2, controller 130 may perform an XOR operation with the final data value 508 and the current value of the parity page 507 and store the result (shown in FIG. 5C as "P") as the current value of the parity page 507 corresponding to Stripe 2. Controller 130 may then write the current value of the parity page 507 to the location of the parity value 509 (denoted in FIG. 5C as "P2") for stripe 2 (i.e. the parity value 509 of Stripe 2 may be assigned the current value of parity page 507).

Figure 5D:
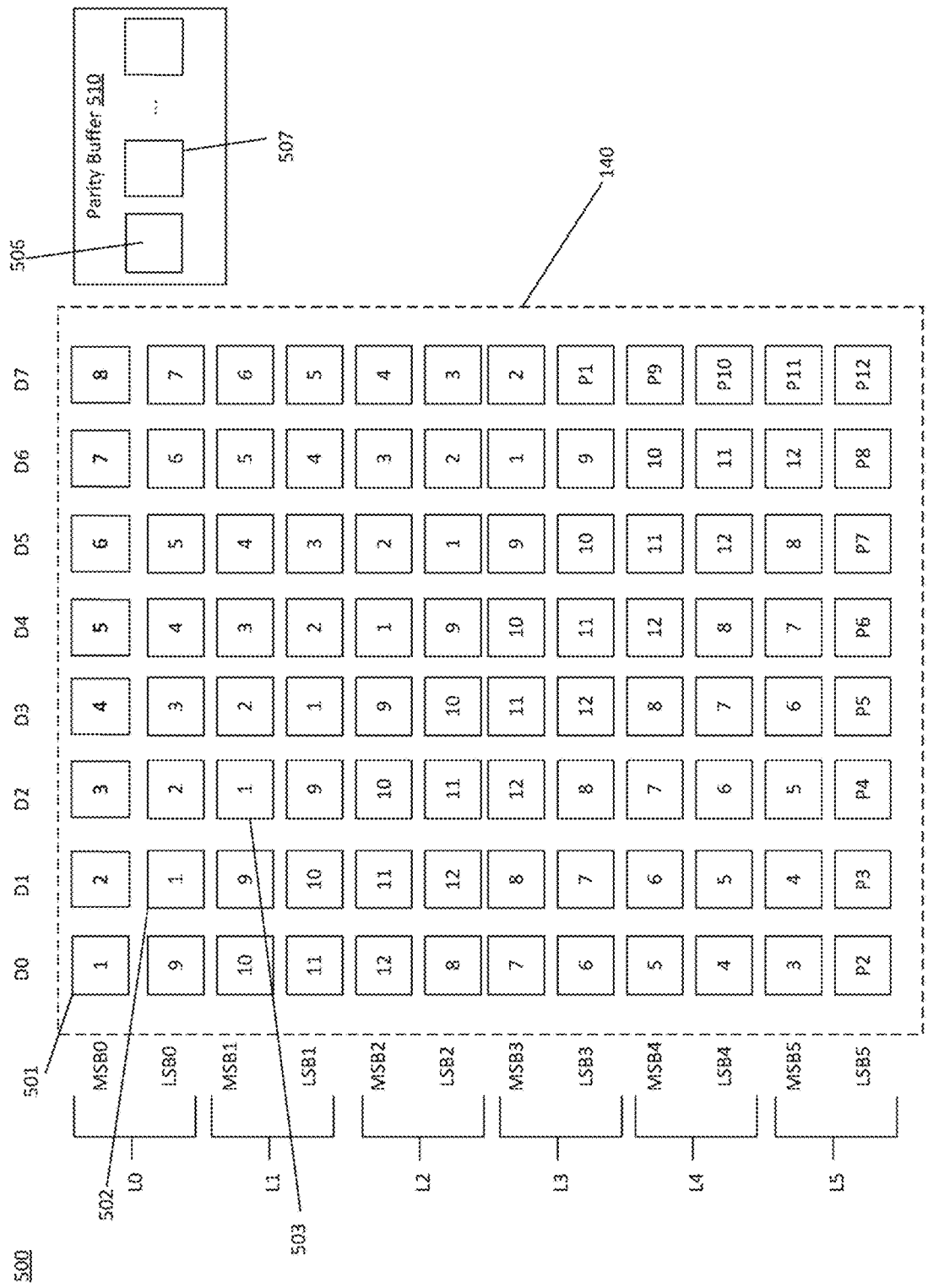

FIG. 5D illustrates the logical layout 500 after all stripes 1-8 have been written. As can be seen, every stripe 1-8 is distributed across a word line of each layer L0-L5 of each die D0-D7. In this way, the RBER variation seen between the MSB and the LSB of word lines, between layers L0-L5, and between dies DQ-D7 may be distributed across all the values of a stripe. As a result, the RBER variation seen between the MSB and the LSB of word lines, between layers L0-L5, and between dies D0-D7 is averaged over the values of a stripe. Controller 130 may thus determine an ECC for a stripe based on the average RBER, instead of the worst case RBER, thereby allowing the controller 130 to use a weaker ECC and saving computational resources and/or storage space. For example, a weaker ECC may use less computational resources (e.g., less computing power) to decode codewords. In another example, a weaker ECC may use less storage space to store codewords generated using the weaker ECC.

Figure 6:
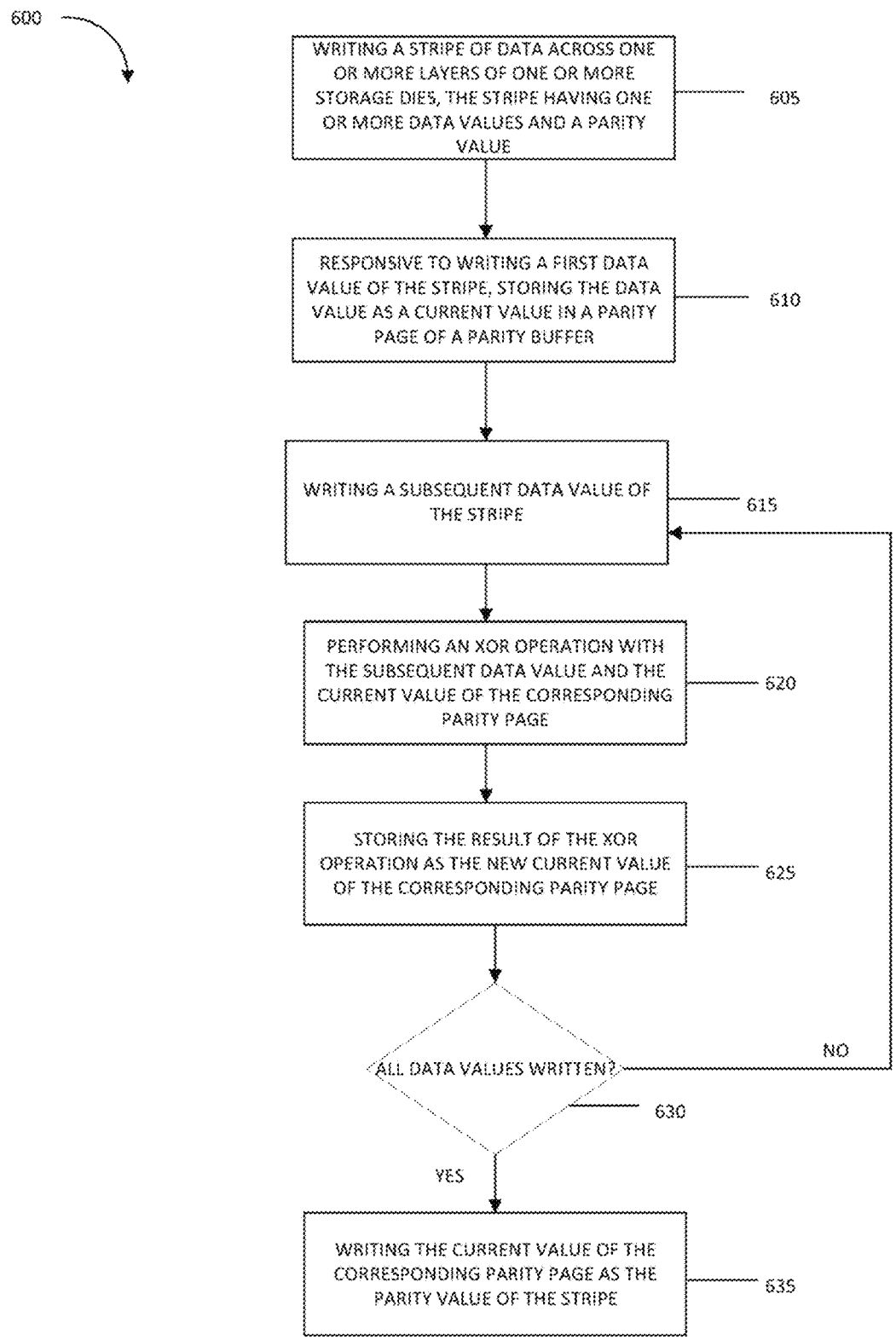
FIG. 6 is a flow diagram illustrating a method of writing a data stripe, in accordance with one or more embodiments of the present disclosure.

FIG. 6 illustrates a (low diagram of a method 600. The method 600 may be performed by a processing device (e.g., a processor, a central processing unit (CPU), a controller, an application-specific integrated circuit (ASIC), a field programmable gate array (FPGA), etc.), a computation engine, etc. For example, the method 600 may be performed by a controller and or a computation engine of a data storage device, such as controller 130 illustrated in FIG. 1. The controller, processing device, and or computation engine may be processing logic that includes hardware (e.g., circuitry, dedicated logic, programmable logic, microcode, etc.), software (e.g., instructions run on a processor to perform hardware simulation), firmware, or a combination thereof.

At block 605, the controller may write a stripe of data across one or more layers of one or more dies of NVM 140. The stripe may have one or more data values and a parity value. More specifically, the controller may write N pages in parallel to NVM 140, where N is given as:

$$N = (\text{number of dies}) \times (\text{number of planes in a die}) \times (\text{number of pages in a wordline})$$

The controller need not wait for N pages worth of data before writing to the NVM 140, however. As long as the controller has received enough data for at least one wordline in a 3D NAND flash memory, it may write to NVM 140 directly so long as the controller knows where it will write to next (because 3D NAND supports one shot programming, whereas for 2D NAND flash, the controller writes data in logical page unit). At block 610, responsive to writing a first data value of the stripe, the controller may store the first data value as a current value in a parity page of a parity buffer. The parity page may correspond to the stripe being written. At block 615, the controller may write a subsequent data value. At block 620, the controller may perform an XOR operation with the subsequent data value and the current value of the corresponding parity page. At block 625, the controller may store the result of the XOR operation as the new current value of the corresponding parity page. At block 630, the controller may determine whether all the data values are written. If there are still data values to be written, the controller returns to block 615. If all data values are written, then at block 635 the controller writes the current value of the corresponding parity page to the parity value of the stripe.

Figure 7:
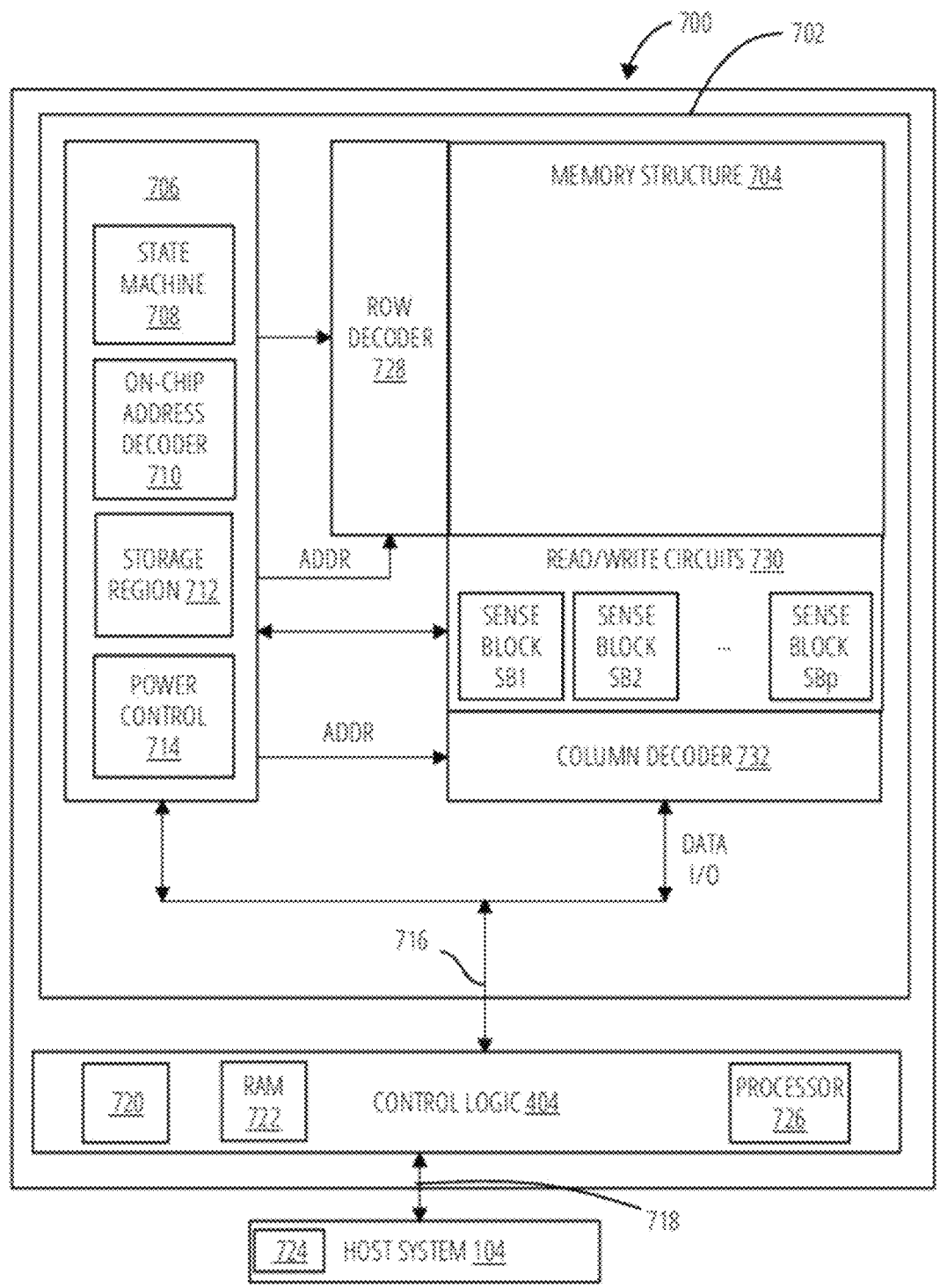
FIG. 7 is a block diagram of a non-volatile data storage system, in accordance with one or more embodiments of the present disclosure.

FIG. 7 is a block diagram of an exemplary non-volatile data storage system 700, which may be similar to data storage system 100 illustrated in FIG. 1. The non-volatile data storage system 700 may include one or more memory die 702. The memory die 702 includes a memory structure 704 of memory cells, such as an array of memory cells herein referred to as a memory array, address controller 706, and read write circuits 730. The memory structure 704 is addressable by word lines via a row decoder 728 and by bit lines via a column decoder 732. The read/write circuits 730 include multiple sense blocks SB1, SB2, . . . , SBp (sensing circuitry) and allow a page of memory cells to be read or programmed in parallel. Typically the memory system-based control logic 404 is included in the same non-volatile memory system 700 (e.g., a removable storage card) as the one or more memory die 702. Control commands and data (e.g., a raw video stream) are transferred between the host system 104 and memory system-based control logic 404 via a data bus 718, and between the controller and the one or more memory die 702 via lines 716. The data bus 718 may for example be a PCIe serial memory bus.

The memory structure 704 can be 2D (laid out in a single fabrication plane) or 3D (laid out in multiple fabrication planes). The memory structure 704 may comprise one or more array of memory cells including a 3D array. In one embodiment, the memory structure 704 may comprise a monolithic three-dimensional memory structure (3D array) in which multiple memory levels are formed above (and not in) a single substrate, such as a wafer, with no intervening substrates. The memory structure 704 may comprise any type of non-volatile memory that is monolithically formed in one or more physical levels of arrays of memory cells having an active area disposed above a silicon substrate. The memory structure 704 may be in a non-volatile memory device (e.g. Non-volatile memory system 700) having circuitry associated with the operation of the memory cells, whether the associated circuitry is above or within the substrate.

The address controller 706 cooperates with the read write circuits 730 to perform memory operations on memory cells of the memory structure 704, and includes a state machine 708, an address decoder 710, and a power control 714. The state machine 708 provides control of memory operations. A store region selector 712 may be provided, e.g., for programming parameters as described further below.

The address decoder 710 provides an address interface between that used by the host or a memory system-based control logic 404 to the hardware address used by the row decoder 728 and column decoder 732. The power control 714 controls the power and voltages supplied to the various control lines during memory operations. The power control 714 and or read/write circuits 730 can include drivers for word lines, source gate select (SGS) transistors, drain gate select (DOS) transistors, bit lines, substrates (in 20 memory structures), charge pumps, and source lines. The sense blocks can include bit line drivers and sense amplifiers in one approach.

An SGS transistor is a select gate transistor at a source end of a memory string, and a DOS transistor is a select gate transistor at a drain end of a memory string.

In some implementations, some of the components can be combined. In various designs, one or more of the components (alone or in combination), other than memory structure 704, can be thought of as at least one control circuit or controller which is configured to perform the techniques described herein. For example, a control circuit may include any one of, or a combination of, address controller 706, state machine 708, address decoder 710, column decoder 732, power control 714, control processor 726, sense blocks SB1, SB2, . . . , SBp, read/write circuits 730, memory system-based control logic 404, and so forth.

The memory system-based control logic 404 may comprise a control processor 726 and memory devices such as controller read-only memory 720 and controller volatile memory 722.

The memory devices of the memory system-based control logic 404 may comprise code such as a set of instructions, that configure the control processor 726 to execute the set of instructions to provide aspects of the functionality described herein. Alternatively or additionally, the control processor 726 can access code from the memory structure 704, such as a reserved area of memory cells in one or more word lines.

For example, code can be used by the memory system-based control logic 404 to access the memory structure 704, controller read-only memory 720, or controller volatile memory 722 for partial decoding and/or event detection logic. In some embodiments the control logic may utilize the host system volatile memory 724 for caching some or all of the raw video stream for partial decoding and event detection, using for example direct memory access technology (DMA) over the data bits 718. The control logic may further include drivers to perform basic tasks such as controlling and allocating memory, prioritizing the processing of instructions, and controlling input and output ports.

Generally, the control logic can include software and other logic (e.g., circuits, firmware) to perform the functions described herein. The control logic may comprise a sequencer to control the liming (start and stop times, durations, spacing etc.) of the various signals described herein. The state machine 708 may also be utilized to implement aspects of the control logic.

In one embodiment, the host system 104 is a computing device (e.g., laptop, desktop, smartphone, tablet, digital camera) that includes one or more processors, one or more processor readable storage devices (host system volatile memory 724. ROM, flash memory, hard disk drive, solid state memory) that store processor readable code (e.g., software) for programming the one or more processors to perform aspects of the techniques described herein. The host system 104 may also include additional system memory, one or more input output interfaces and/or one or more input output devices in communication with the one or more processors, as well as other components well known in the art.

The store region selector 712 may be a non-volatile memory such as NAND flash memory, or another type. The store region selector 712 identities blocks of the memory structure 704 for reading and writing, among other things, as known in the an.

One of skill in the art will recognize that the non-volatile memory system 700 is an example and that various implementations will include additional components, or exclude or combine some of the illustrated components, in manners known in the art.

General Comments

Those skilled in the art will appreciate that in some embodiments, other types of distributed data storage systems may be implemented while remaining within the scope of the present disclosure. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described heroin may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or" That is, unless specified otherwise, or clear from context, "X includes A or B" is intended to mean any of the natural inclusive permutations. That is, if X includes A: X includes B; or X includes both A and H, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc. as used herein are meant as labels to distinguish among different elements and may not necessarily have an ordinal meaning according to their numerical designation.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. An apparatus comprising:
a parity buffer configured to store a plurality of parity pages;
one or more dies, each die having a plurality of layers in which data may be written; and
a storage controller configured to:
write a stripe of data across two or more layers of the one or more dies, the stripe having one or more data values and a parity value;
responsive to writing a first data value of the stripe, store the first data value as a current value in a parity page of the parity buffer, the parity page corresponding to the stripe; and
responsive to writing each subsequent data value of the stripe, perform an XOR operation with the subsequent data value and the current value of the corresponding parity page and store a result as the current value of the corresponding parity page;

wherein a residual bit error rate (RBER) of each of the two or more layers is averaged across the one or more data values in the stripe, such that the average RBER is lower than a worst case RBER; and wherein an error correction code (ECC) is based on the average RBER.

2. The apparatus of claim 1, wherein to write the stripe, the storage controller is further configured to: write the stripe across a word line in each of the two or more layers.

3. The apparatus of claim 2, wherein to write the stripe across a word line, the storage controller is further configured to:

write a data value of the stripe into a most significant bit page of the word line and write a subsequent data value of the stripe into a least significant bit page of the word line.

4. The apparatus of claim 1, wherein the storage controller is further configured to:

responsive to writing a final data value of the stripe, perform an XOR operation with the final data value and the current value of the corresponding parity page and store a result as the current value in the corresponding parity page; and write the current value in the corresponding parity page to the parity value of the stripe.

5. The apparatus of claim 1, wherein the storage controller is further configured to:

write one or more subsequent stripes of data across the two or more layers of each of the one or more dies, each of the one or more subsequent stripes having one or more data values and a parity value.

6. The apparatus of claim 1, wherein the parity buffer comprises a persistent storage medium.

7. A method comprising:

writing a stripe of data across two or more layers of one or more dies, the stripe having one or more data values and a parity value;

responsive to writing a first data value of the stripe, storing the first data value as a current value in a parity page of a parity buffer, the parity page corresponding to the stripe; and responsive to writing each subsequent data value of the stripe, performing an XOR operation with the subsequent data value and the current value of the corresponding parity page and storing a result as the current value of the corresponding parity page;

wherein a residual bit error rate (RBER) of each of the two or more layers is averaged across the one or more data values in the stripe, such that the average RBER is lower than a worst case RBER; and wherein an error correction code (ECC) is based on the average RBER.

8. The method of claim 7, wherein writing the stripe comprises writing the stripe across a word line in each of the two or more layers.

9. The method of claim 8, wherein writing the stripe across a word line comprises:

writing a data value of the stripe into a most significant bit page of the word line and writing a subsequent data value of the stripe into a least significant bit page of the word line.

10. The method of claim 7, further comprising:

responsive to writing a final data value of the stripe, performing an XOR operation with the final data value and the current value of the corresponding parity page and storing a result as the current value in the corresponding parity page; and writing the current value in the corresponding parity page to the parity value of the stripe.

11. The method of claim 7, further comprising:

writing one or more subsequent stripes of data across the two or more layers of each of the one or more dies, each of the one or more subsequent stripes having one or more data values and a parity value.

12. A non-transitory machine-readable medium having executable instructions to cause one or more processing devices to perform a method, the method comprising:

writing a stripe of data across two or more layers of one or more dies, the stripe having one or more data values and a parity value;

responsive to writing a first data value of the stripe, storing the first data value as a current value in a parity page of a parity buffer, the parity page corresponding to the stripe; and responsive to writing each subsequent data value of the stripe, performing a parity calculation operation with the subsequent data value and the current value of the corresponding parity page and storing a result as the current value of the corresponding parity page;

wherein a residual bit error rate (RBER) of each of the two or more layers is averaged across the one or more data values in the stripe, such that the average RBER is lower than a worst case RBER; and wherein an error correction code (ECC) is based on the average RBER.

13. The non-transitory machine-readable medium of claim 12, wherein writing the stripe comprises writing the stripe across a word line in each of the two or more layers.

14. The non-transitory machine-readable medium of claim 13, wherein writing the stripe across a word line comprises:

writing a data value of the stripe into a most significant bit page of the word line and writing a subsequent data value of the stripe into a least significant bit page of the word line.

15. The non-transitory machine-readable medium of claim 12, wherein the method further comprises:

responsive to writing a final data value of the stripe, performing a parity calculation operation with the final data value and the current value of the corresponding parity page and storing a result as the current value in the corresponding parity page; and writing the current value in the corresponding parity page to the parity value of the stripe.

16. The non-transitory machine-readable medium of claim 12, further comprising:

writing one or more subsequent stripes of data across the two or more layers of each of the one or more dies, each of the one or more subsequent stripes having one or more data values and a parity value.

* * * * *